US009915699B2

(12) United States Patent
Wang et al.

(10) Patent No.: US 9,915,699 B2
(45) Date of Patent: Mar. 13, 2018

(54) INTEGRATED FAN-OUT PILLAR PROBE SYSTEM

(71) Applicant: Taiwan Semiconductor Manufacturing Company, Ltd., Hsin-Chu (TW)

(72) Inventors: Mill-Jer Wang, Hsin-Chu (TW); Ching-Nen Peng, Hsin-Chu (TW); Hung-Chih Lin, Hsin-Chu (TW); Hao Chen, New Taipei (TW); Mincent Lee, Taipei (TW); Chen-Hung Tien, Hsin-Chu (TW); Chang Chia How, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 514 days.

(21) Appl. No.: 14/488,852

(22) Filed: Sep. 17, 2014

(65) Prior Publication Data
US 2016/0077147 A1 Mar. 17, 2016

(51) Int. Cl.
*G01R 31/28* (2006.01)
*G01R 3/00* (2006.01)

(52) U.S. Cl.
CPC ........... *G01R 31/2893* (2013.01); *G01R 3/00* (2013.01); *G01R 31/2891* (2013.01); *G01R 31/2894* (2013.01)

(58) Field of Classification Search
CPC ..... G01R 31/26; G01R 31/2886; G01R 1/067
USPC .......................................... 324/750.25, 754.1
See application file for complete search history.

(56) References Cited

U.S. PATENT DOCUMENTS

| 6,127,831 A | * | 10/2000 | Khoury ................. G01R 31/316 324/750.02 |
| 2007/0233629 A1 | * | 10/2007 | Balog ............... G01B 31/31831 706/47 |
| 2012/0123734 A1 | * | 5/2012 | Linde .................. G01R 31/2891 702/150 |

* cited by examiner

*Primary Examiner* — Melissa Koval
*Assistant Examiner* — Courtney McDonnough
(74) *Attorney, Agent, or Firm* — Slater Matsil, LLP

(57) ABSTRACT

A method of probe testing dies, the method includes loading a wafer having a first die and a second die into a prober and bringing probes of the prober into contact with first contact pads of the first die according to first probe parameters. A first probe contact test of first values of the contact between the probes and the first contact pads is performed, and a die test of the first die is performed after performing the probe contact test. Results of the die test and results of the probe contact test are saved and second probe parameters are automatically generated based on at least the results of the first probe contact test.

20 Claims, 4 Drawing Sheets

INTEGRATED FAN-OUT PILLAR PROBE SYSTEM

BACKGROUND

As semiconductor technologies evolve, three-dimensional integrated circuits emerge as an effective alternative to further reduce the physical size of a semiconductor chip. In a three-dimensional integrated circuit, active circuits are fabricated on different wafers and each wafer die is stacked on top of another wafer die using pick-and-place techniques. Much higher density can be achieved by employing vertical stacking of integrated circuits. Furthermore, three-dimensional integrated circuits can achieve smaller form factors, cost-effectiveness, increased performance and lower power consumption.

In the process of manufacturing three-dimensional integrated circuits, known good die (KGD) and known good stack (KGS) tests are often performed through various testing probe card at various stages during the manufacturing process. Probe cards are one type of test structure used to perform electrical tests of dies. The probe card may be coupled between an automatic testing equipment board and a semiconductor die under test. The probe card makes contact with the semiconductor die through a plurality of probe contacts and the automatic testing equipment send signals through the probes to the die and reads the output and determines the performance of the die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
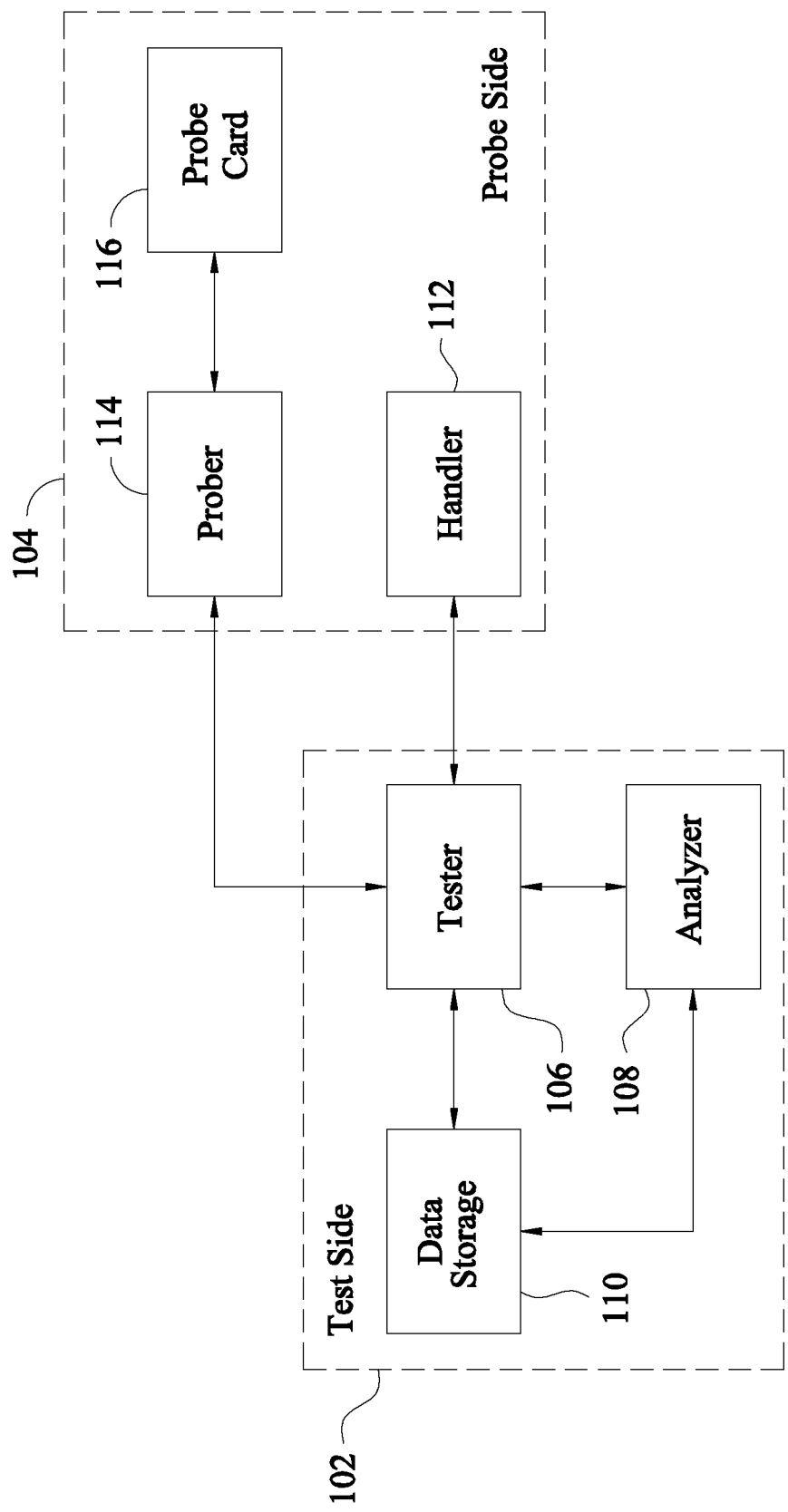
FIG. 1 is a logical diagram illustrating a system for die probe testing according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor processing, dies or chips are formed in groups on wafers, permitting bulk processing of the dies. Integrated circuits with active devices are formed on the surface of a semiconductor substrate such as silicon, gallium arsenide, or the like, and connective elements are formed in redistribution layers (RDLs) over the substrate surface to form the integrated circuits. The RDLs provide electrical connectivity between devices in the integrated circuit and between the integrated circuit and external devices. Conductive pads with connecting studs, conductive bumps, solder balls or the like are formed at the surface of the wafer permitting electrical communication between external devices and with the dies on the wafer.

During formation of the integrated circuits, process variations create devices having a variety of performance characteristics, some of which may cause an integrated circuit to operate outside of design tolerances. In order to identify dies that fall outside of designed performance tolerances, the dies are tested at various stages of fabrication. The most thorough tests are performed near completion of the fabrication process by testing the actual performance characteristics of the completed circuit. Primary testing of dies is performed using, for example, a probe card having probes that contact the contact pads or bumps on the die. Electrical signals are sent through the probes, and the output signal is read through the probes.

It has been discovered that managing the state and quality of contact between the probes and the contact pads increases the reliability of the probe test, increasing the yield of good dies from each wafer. Described herein is a system for optimizing and automatically controlling the contact pressure of the probes on a contact pad, the number of times a probe contacts a contact pad before beginning testing, the frequency of cleaning the tips of the probes, and other probe parameters. The system causes the probes to make contact with a contact pad according to parameters that are determined according to the type of die, the production lot of the wafer, physical characteristics of the wafer, physical characteristics of the die, and test parameters generated from tests of previous dies and wafers or previous tests of the same die. Embodiments of the system also test the quality of the contact between the probes and the contact pad, and adjust the contact parameters of subsequent tests or cause the probes to re-attempt contact with the contact pad using adjusted contact parameters if the quality of contact is below a predetermined threshold. Additionally, data from the testing of the dies or the probe contacts is used to adjust the parameters for probe contact when retesting failed dies and testing of subsequent dies.

FIG. 1 is a logical diagram illustrating a system for die probe testing according to some embodiments. A system for probe testing of dies has a test side 102 and a probe side 104. The test side 102 manages and controls one or more sets of equipment on the probe side 104. The probe side 104 handles the wafers, physically manipulates the probes and performs the actual testing of dies on a wafer.

The test side 102 has a tester 106 that sends instructions to a prober 114 and handler 112 on the probe side 104. The tester 106 also receives test data from the prober 114. The tester 106 fetches test and probe parameters from a data storage module 110 on the test side, and transmits that data to the probe side 104 for testing dies and probe contact quality.

The test side 102 also has an analyzer 108 that analyzes test results received by the tester 106 to determine whether a die passes a die test and generates probe or die test parameters based on baseline parameters and/or previous test data. In some embodiments, the analyzer 108 also determines whether a die that fails the die test should be retested with modified probe contact parameters, and whether the base parameters for testing dies should be modified. The analyzer 108 also optimizes the yield of the dies on each wafer by analyzing the test results from the dies in conjunction with the historical test data. The optimization of the yield is described in greater detail below.

The probe side 104 has a prober 114 that controls a probe card 116, causing probes on the probe card 116 to contact a die for testing. A handler 112 moves wafers onto a testing support surface, where the wafer is retained while each die on the wafer is tested with the probe card. After testing, the handler 112 removes the wafer, and replaces it with a new wafer for testing.

Figure 2:
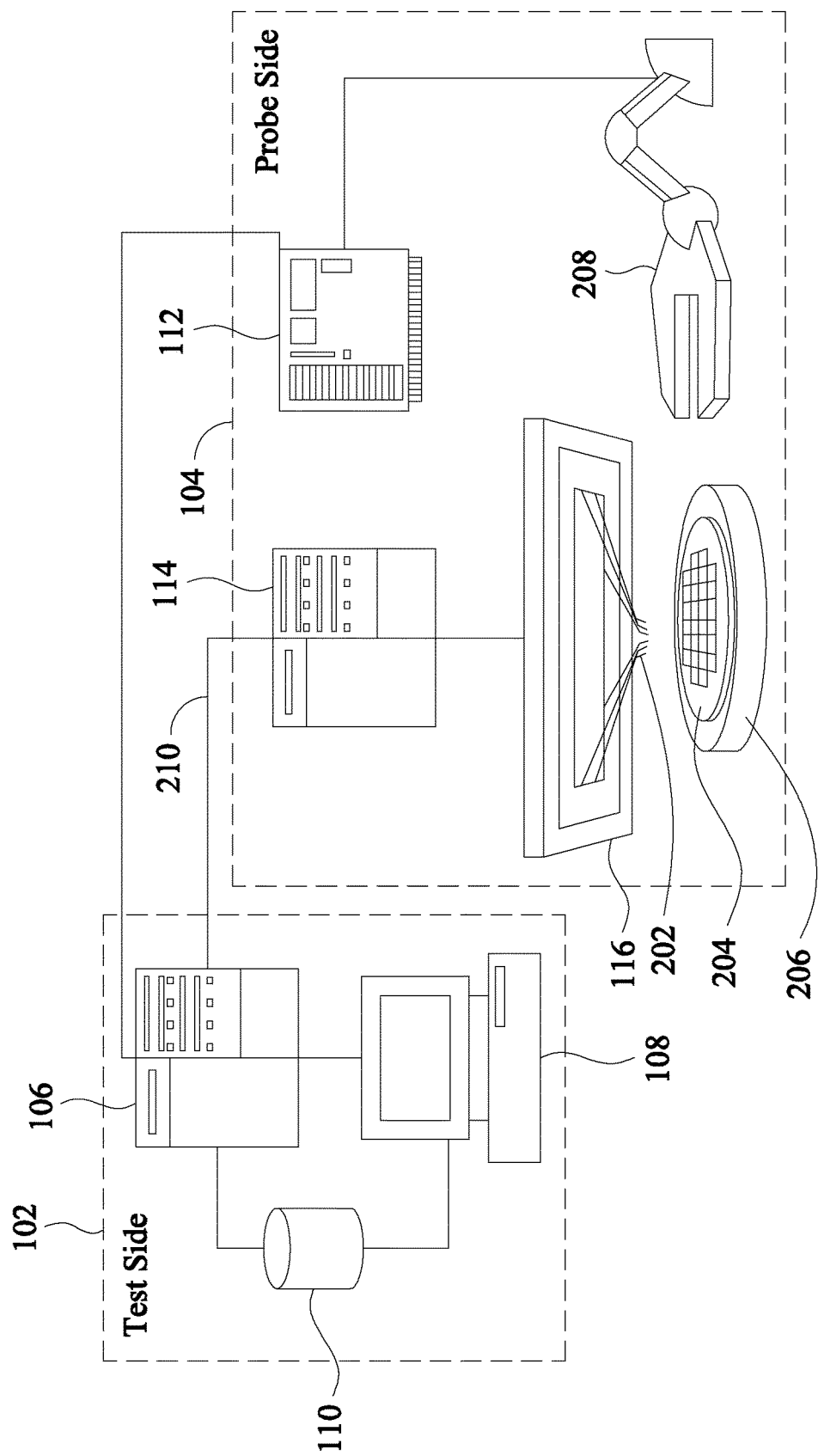
FIG. 2 is a diagram illustrating hardware system for die probe testing according to some embodiments.

FIG. 2 is a diagram illustrating hardware system for die probe testing according to some embodiments. The tester 106 is a computer system having instructions stored on a nontransitory computer readable for generating probing and test instructions that are, at least in part, determined according to the type of die, the production lot of the wafer, physical characteristics of the wafer, physical characteristics of the die, and test parameters generated from tests of previous dies and wafers or previous tests of the same die. Additionally, the tester 106 has a processor for executing those instructions. In some embodiments, the data storage 110 is a database, file, cloud storage system or other data storage system that stores data on a non-transitory computer readable medium such as a hard drive, solid state drive, computer memory such as RAM, SDRAM, flash memory or the like.

In some embodiments, the analyzer 108 is in signal communication with the data storage module 110 and the tester 106. Additionally, in some embodiments, the analyzer 108 is integrated into the tester 106, and in other embodiments, the analyzer 108 is a computer system separate from, but connected to, the tester 106. The analyzer 108 determines the probe parameters and die test parameters and stores the parameters in the data storage module 110 or transmits the parameters directly to the tester 106. The tester 106 uses the probe parameters and die test parameters to generate the instructions for controlling the prober 114. The analyzer 108 fetches historical test data from the data storage module 110 and optimizes the testing of dies to achieve greater yields from dies by ensuring that the probe parameters result in a good contact with the dies for testing.

The handler 112 is a computer system or control system that, in some embodiments, receives instructions from the tester 106 to load a particular wafer 204 onto a testing platform 206 using a robot arm or manipulator 208. The testing platform 206 is, in some embodiments, a vacuum chuck, mechanical chuck or other wafer retaining structure. In some embodiments, the handler 112 ensures that the wafer 204 is generally aligned in an acceptable orientation and that the wafer 204 sits flat on the testing platform 206. The testing platform 206 secures wafer to prevent the wafer 204 from shifting during testing. The handler 112 and/or the tester 106 control, in some embodiments, the parameters for retaining the wafer 204. For example, the tester 106 may determine that a particular wafer 204 requires a vacuum chuck at the testing platform to pull a vacuum at a predetermined pressure in order to correctly retain the wafer to the testing platform. In such an example, the tester 106 may send instructions based on testing parameters for a particular vacuum pressure directly to a vacuum control at the testing platform 206, or the tester 106 may send that parameter as part of the testing setup to the prober 114, which in turn, causes the testing platform 206 to apply the specified vacuum pressure.

The prober 114 controls the alignment and movement of a probe card 116 or cartridge. The probe card 116 has probes 202 that are, in some embodiments, cantilevered elements with conductive tips. While the probe card 116 is illustrated here has having only a few probes 202, the probe card 116 is not limited to such an embodiment, as the probe card 116 can have any number of probes 202 in any arrangement. The prober 114 brings the probe card 116 into a position where the tips of the probes 202 contact the contact pads of a device under test. The prober 114 has circuitry configured to send signals through the probes 202 to a device under test and read a voltage or current to determine the performance characteristics of the device. The alignment of the probes 202 to the device under test controls where the probe tips contact the contact pads.

The quality of the contact between the probe tips and the contact pads of a device under test determines whether test results for the device are accurate. Insufficient contact between the tips of the probes 202 and the die contact pads results, in some cases, in test results that indicate that a good die has failed the die test. For example, a dirty probe tip, a contact pad with excess oxidation, or a probe 202 that is not pressed against a contact pad with sufficient force may result in a contact resistance between the probes 202 and contacts pads that reduces the voltage or current used to test the die. In such an example, a device such as a transistor may read as not having sufficient current passing through the transistor due to high resistance at the contact pads.

It has been discovered that the yield of a wafer, or the number of dies on a wafer that test as good, can be increased by monitoring the quality of contact between probes and the contact pads for a die under test. Probe parameters such as the overdrive of the probes 202, the touchdown of the probes 202 and the cleaning frequency of the probes 202 can be optimized to take into account the conditions measured in previous tests for similar dies from a same lot or from a same wafer. In some embodiments, a die may be tested more than once, and measurements and parameters used in previous tests for the same die are considered when determining the probe parameters for a particular die. Additionally, parameters such as the surface topography variations due to, for example, wafer warping caused by device production, temperature, or retention force on the testing platform 206 can be compensated for by optimizing the probe parameters. The tester 106 sends probe parameters and die test instructions over a communications bus 210 such as a general purpose interface bus (GPIB) to the prober 114. The prober 114 executes the instructions to bring the probes 202 into contact with dies, and to control the handling and testing of the dies. The tester 106 brings the probes 202 into contact with the die according to the probe parameters and then tests the quality of the contact between the probes 202 and the contact pads to verify that subsequent die test results accurately reflect the performance of the die.

The overdrive of a probe 202 is an indication of the force with which a probe 202 presses on a contact pad. The nominal location of a contact pad, including the expected height above the testing platform surface, is known prior to testing, and the dimensions of the probes 202 are also known. Thus, the location at which the probe 202 should contact a contact pad can be determined prior to testing. The overdrive indicates a distance by which the probe card 116 is moved toward the die after the probe tip should make initial contact with the contact pad. The probes 202 are cantilevered out from the probe card 116 and are formed from an elastic material. Thus, by making contact between the probe tips and the contact pad, and then moving the probe card 116 closer to the contact pad, the springiness of the probes 202 exerts a spring pressure on the contact pad that is proportional to the overdrive. However, the contact pads are generally formed from a substantially thin metal layer. Applying too much force to the contact pads with a high overdrive could cause the probe to damage the contact pad, and even punch a hole in the contact pad. Therefore, tests are run with the probe overdrive set to a minimum value that is expected to give a good test result. For example, an overdrive parameter might have a minimum value of about 50 µm, that is, the probe card is brought toward the contact pads so the probes would be 50 µm below the surface of the contact pad if it were not there. The overdrive could be increased, but the pressure caused by the increased overdrive can, in some instances, damage the contact pads.

Additionally, warping of the wafer causes the contact pad to be raised higher than would be expected in a perfectly flat wafer, resulting in a pressure on the contact pad by the probe tip that varies from the intended probe pressure. Thus, the surface topography variations affect the amount of overdrive that is be applied to a die, as a raised contact pad will increase the effective overdrive. Therefore, in some embodiments, the overdrive parameter is modified to take into account a wafer parameter such as the warpage of the wafer.

The touchdown of a contact pad is a probe parameter that indicates the number of times a probe is brought into contact with a contact pad before testing. The touchdown count is the number of times the probe touches, and is separated from, the contact pad. The contact pads are, in some embodiments, copper, aluminum or another metal, and may have some surface or native oxidation at the surface. The oxidation at the surface of the contact pads greatly increases the resistance between the probe and the contact pad. Touching the contact pad with the probe tip causes the probe tip to scratch away a portion of the oxidation. An increased touchdown causes more of the oxidation on the contact pad to be removed, clearing the surface for a good contact with the probe. However, a high touchdown, that is, where the probe is brought into contact with the contact pad a large number of times, can damage the surface of contact pad and decreases the useful life of the probe. Additionally, any unnecessary touchdowns increases the time required to test a particular die. For example, a touchdown parameter of 2 indicates that the probe tip is brought into contact with the contact pad and removed twice, and then brought into contact with the contact pad a final time where it remains for testing.

Repeated contact between a probe and contact pads during testing of multiple dies causes contamination and foreign matter to accumulate on the surface of the probe tip. The probe is cleaned by polishing the tips of the probe on a clean sheet or the like. Cleaning the probe tips removes a surface layer of the probe tip, and repeated cleanings eventually erodes the probe tip to the point where the probe is unusable. The frequency of probe cleaning is maintained at the lowest acceptable level to reduce the number of probe card changes required and to increase production throughput, as probe tip cleaning slows the testing process.

Figure 3:
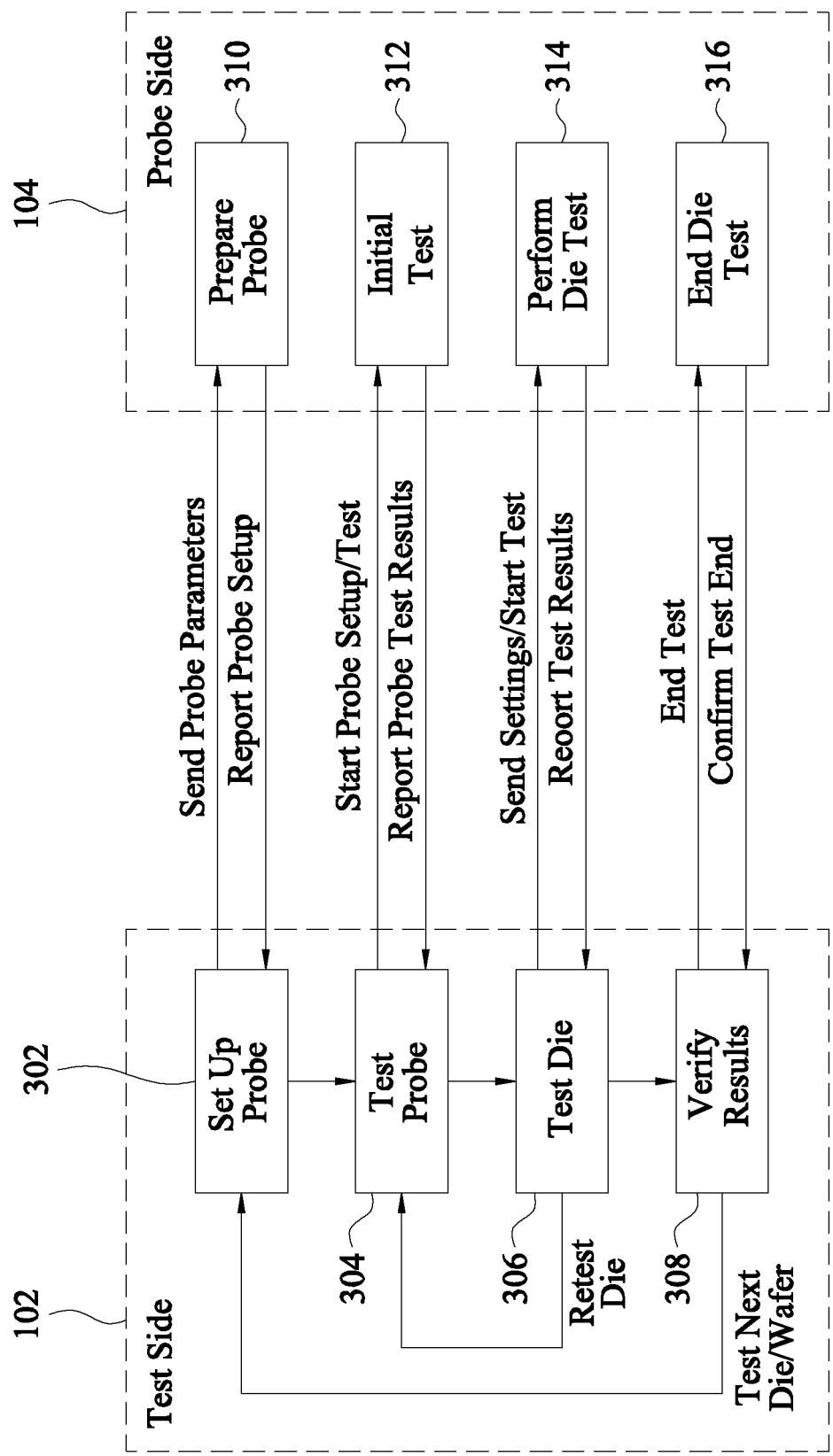
FIG. 3 is a logical diagram illustrating a communications sequence for die probe testing according to some embodiments.

FIG. 3 is a logical diagram illustrating a communications sequence for die and probe testing according to some embodiments. It has been discovered that the test results for a die can be used to optimize probe parameters for retesting the die or testing subsequent dies. In such an embodiment, the test side 102 and probe side 104 communicate during the process of setting up the probe and die tests and during the tests to gather characteristics of the overall wafer and the individual dies on the wafer. The wafer and die characteristics are used in combination with previous probe testing results to determine and optimize the probe parameters by the test side in retesting a die or testing subsequent dies by the probe side 104. It has further been discovered that optimized probe contact parameters permits testing of a die by direct contact between the probe tips and the base material of the contact pad, as the control and monitoring of the probe cleaning, overdrive and touchdown ensure good contact on a surface that might oxidize, eliminating the need for corrosion protection layer on the contact pad. For example, in some embodiments, copper or aluminum studs are exposed at the top of a die and are used as contact pads. The copper or aluminum material tends to oxidize quickly, and the touchdown removes the oxidation layer from the surface of the copper pillar, while the optimized probe cleaning interval ensures that the probe tip is relatively free of contaminants and the overdrive ensures good contact between the probe and pillar. This eliminates the need for a cap of solder or tin (Sb) to prevent oxidation.

The test side 102 sets up the probe in block 302 by sending probe parameters to the probe side 104. In some embodiments, the probe parameters are generated at test time by the tester or the analyzer, and in other embodiments, the probe parameters are generated ahead of time by the analyzer and saved into the data storage module for retrieval by the tester at test time. The probe side 104 uses the probe parameters to set up the probe in block 310. For example, in some embodiments, the probe side 104 loads and chucks a wafer, if needed. The probe side 104 reports a confirmation of probe setup to the test side, along with any gathered wafer or die characteristics.

The test side 102 initiates the probe contact and testing of the probe contact in block 304 by transmitting instructions to start the probe setup and test. In block 312, the probe side 104 receives the probe parameters and test instructions and probes the die according to the instructions and parameters. The prober cleans the probe tips, if needed and aligns the probe over a particular die on the wafer. The prober then brings the probe tips into contact with contact pads on the die according to the touchdown parameter, with at least the final contact between the probe and contact pads being made according to the overdrive parameter. The prober also tests the contact between the probe and the contact pads and reports the results back to the test side.

The test side 102 initiates the test of the devices on the die in block 306 by sending test instructions and a command to begin the die test to the probe side 104. The prober performs the die test in block 314, and reports the results of the die test to the test side. In some embodiments, the prober determines whether a die needs to be retested. In such an embodiment, the analyzer modifies the probe parameters or the die test parameters and the probe test in block 304 is rerun.

The test side 102 verifies results of the die test in block 308 to ensure that a complete set of test results was received, and notifies the probe side 104 that the die test is ended. The probe side 104 terminates the die test sequence in block 316 and acknowledges the end of the die test to the test side. The process repeats for additional dies or wafers.

Figure 4:
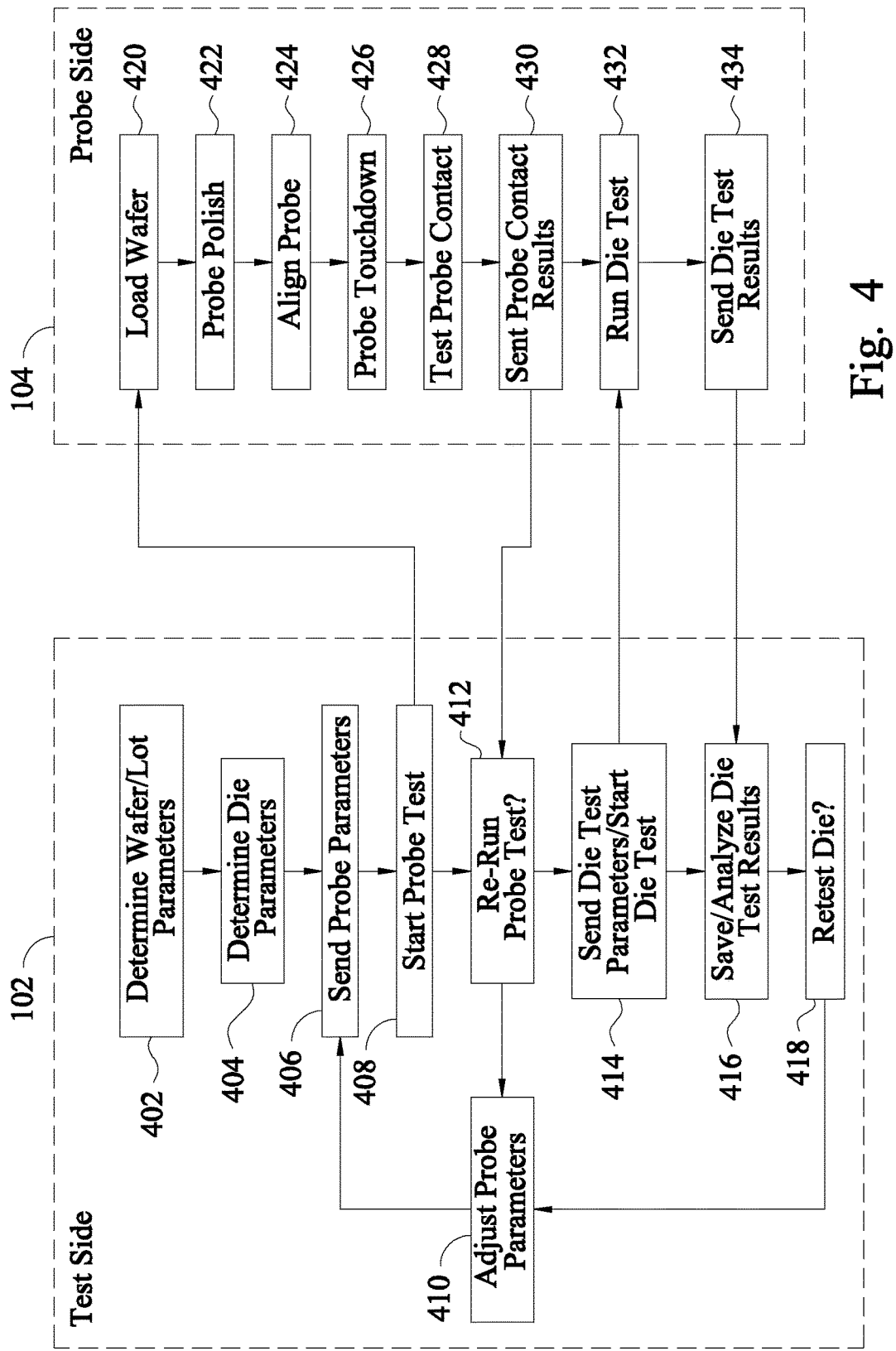
FIG. 4 is a flow diagram illustrating steps of a method for die probe testing according to some embodiments.

FIG. 4 is a flow diagram illustrating steps of a method for die probe testing and according to some embodiments. The method illustrated in FIG. 4 described in greater detail the implemented of the communications sequence described above with respect to FIG. 3. Initially the parameters for a wafer or the wafer lot are determined in block 402. In some embodiments, wafers are formed in lots, with multiple wafers formed, for example, in a single production run, on the same production equipment, using one or more of the same process steps, or the like. For example, a first lot of wafers includes wafers that were formed using the same set of processing equipment, while a second lot of wafers are formed on a different set of processing equipment, with the differences between lots attributable to differences in the production machines. In another example, different lots may be produced on different days or in different production runs and differences in the lots may be attributable to different handling, different environmental factors, or variations in bulk substrate lots or precursor materials. In some embodiments, the probe side 104 may determine wafer characteristics such as, for example, wafer or die warpage by testing strain or temperature sensors embedded in the die or wafer. In other embodiments, the wafer characteristics are received from a third party and stored in the data storage module. For example, dies that are received form a third party manufacturer or from another department may have accompanying data indicating the layout of the contact pads and circuit parameters of the dies and physical characteristics of the wafer, such as a surface topology map or the like.

In block 404, the test side 102 determines the die parameters. The touchdown and overdrive for the particular die are determined using the wafer and lot parameters as a baseline and modifying the baseline based on the tests of previous dies. For example, previous tests of probe contacts for wafers in a particular lot may indicates that a higher touchdown count is required in a particular region of the wafer, or that the probes need to be cleaned sooner than indicated by the probe cleaning frequency. This characteristic may be due to particularly thick oxide layers on the contact pads for dies in region of the die due to imperfections in the fabrication process. In another example, the wafer parameters may indicate that the wafer is warped, and a particular die lies on a ridge or raised portion of the wafer, the overdrive may be reduced to prevent overpressure by the probe.

Additionally, the probe cleaning parameter is determined for a particular die. The probe cleaning parameter indicates whether the probe needs to be cleaned before testing the die. The frequency of probe cleaning dictates whether the probe is cleaned for a particular die, however, the frequency of probe cleaning may be determined by lot, wafer or die parameters. For example, a probe used on a die with copper contact pads may need to be cleaned more frequently than a probe used on solder caps. Additionally, in some embodiments, the probe cleaning frequency is also based on the overdrive and touchdown parameters. For example, a die with a relatively thick contact pad that can accept a higher touchdown count or higher overdrive may not require probe cleaning as frequently, and the cleaning frequency may be 1 cleaning about every 15 dies due to the higher overdrive increasing the contact force and contact surface of the probe, or the higher touchdown count removing contaminants from the probe tip. This frequency is useful where the die testing requires higher throughput with less time allowed for each cleaning, for example, on dies with larger features where individual features such as the contact pads are thicker or larger. In other examples, a die with a thin or soft contact pad may not permit a higher overdrive or touchdown count, and the probe cleaning frequency may be smaller at about 1 cleaning about every 3 dies. In some embodiments, the cleaning frequency is adjusted automatically by the analyzer based on test results from previous dies or probe contact tests. For example, if the baseline cleaning frequency for a wafer is 6, where the probe is cleaned after testing 6 dies, the cleaning frequency may be decreased, to 5 or less, for example, if the resistances values gathered from contact tests on previous dies are greater than resistances measured since the previous cleaning, indicating that contaminants are building up on the probe faster than they are being cleaned off.

In other embodiments, the probe cleaning parameter is based on the yield or on a resistance or series of resistances measured in previous tests. For example, if the yield of a previously tested group of dies falls below a predetermined threshold, the cleaning frequency may be decreased to clean the probes more frequently. In another embodiment, the probe cleaning parameter may be based on a factor other than a fixed frequency. For example, the probe may be cleaned when the resistance measured in a probe contact test for the previous die exceeds a predetermined threshold.

In block 406, the test side passes probe parameters for probing a die to the probe side, and the test side sends a command to start the probe test in block 408. The probe side then loads the wafer in block 420 if needed. In some embodiments, the wafer is loaded prior to determining the wafer and lot parameters, and the wafer parameters are determined from the loaded wafer. For example, wafer parameters such as warp, stress or temperature may be determined from the wafer by testing strain or temperature sensors embedded in the wafer. In other embodiments, the wafer is loaded already and the loading step is omitted, or the wafer parameters are known prior to loading the wafer.

The probes are polished in block 422, if needed, and the probes are aligned over the die to be tested in block 424. In embodiments, the die, lot and wafer parameters are used to align the probes. For example, the temperature of the wafer may cause the wafer to expand and cause some offset in the expected position of the contact pads. The wafer temperature, the originally expected position for the contact pads, the warpage of the wafer, and, in some embodiments, additional factors, are used to align the probes with the contact pads of the die.

In block 426, the probes are brought into contact with the contact pads. In some embodiments, the touchdown parameter is used to determine the number of times the probes contact and are moved away from the contact pads to scratch the contact pad surface. The final contact between the probes and the contact pads is maintained after any optional touchdowns, and the contact is maintained with the specified overdrive.

In block 428, the contact of the probes is tested. In some embodiments, a voltage or current is passed through pairs of probes to determine the resistance of the contact between the probes and the contact pads. For example, two probes may be electrically connected by a conductive line on the die having a known resistance. Applying a voltage across that line with two probes gives a total resistance circuit from which the probe contact resistance can be determined. The results of the probe test are sent to the test side in block 430. In some embodiments, the test side analyzes the results and determines in block 412 whether the probe contact test needs to be rerun. For example, if the probe contact test results indicate that one or more of the probes has no contact, or a contact resistance that exceeds and acceptable threshold, then the probes parameters may be adjusted in block 410 and the probes reset to perform a subsequent probe contact test.

After the probe test, the die test parameters are sent to the probe side in block 414, and the probe side runs the die test in block 432. The die test results are sent to the test side in block 434, and the results are saved and/or analyzed in block 416. In some embodiments, the results of the probe contact test are sent to the test side with the results of the die test. In other embodiments, the probe contact test results are sent to the test side prior to beginning the die test, and the die test results are sent to the test side separately from the probe contact test results. In some embodiments, the test side determines in block 418 whether to retest the die based on the die test results and/or the probe contact test results. In block 410, the probe parameters for retesting the same die, for reprobing and retesting the probe contact, or for testing subsequent dies are adjusted. In some embodiments, the wafer or lot parameters are also updated or modified.

In some embodiments, the results of the probe contact test and die test are saved to the data storage module. The analyzer uses the test results to determine whether baseline parameters for the die, wafer or lot need to be modified, and what the test parameters for subsequent die tests should be. For example, the analyzer may receive test data indicating a die failed a test. The analyzer may retrieve data related to the wafer and for tests of previous dies on the wafer from data storage. The probe contact test results for dies that are sensitive to contact resistance may indicate that the contact resistance was high for that type of die. The probes may be polished or cleaned to remove contaminants, and the die may be retested. In another example where a die has an overdrive of 100 μm, the analyzer receives a probe test result indicating a high contact resistance and increases the overdrive for the next die test to 130 μm to lower contact resistance. The modification may be applied to subsequent die tests, and the baseline lot or wafer parameters may be modified as well.

Thus, according to an embodiment, a method of probe testing dies comprises loading a wafer having a first die and a second die into a prober and bringing probes of the prober into contact with first contact pads of the first die according to first probe parameters. A first probe contact test of first values of the contact between the probes and the first contact pads is performed, and a die test of the first die is performed after performing the probe contact test. Results of the die test and results of the probe contact test are saved and second probe parameters are automatically generated based on at least the results of the first probe contact test.

A method according to another embodiment comprises determining a wafer parameter for a wafer in a die test system, determining first probe parameters for a first die on the wafer based on at least the wafer parameter and bringing a probe into contact with a first contact pad of the first die according to the first probe parameters. A first probe contact test of contact between the probe and the first contact pad is performed and second probe parameters for a second die are automatically determined based on at least first results of the first probe contact test. The probe is brought into contact with a second contact pad of the second die according to the second probe parameters and a second probe contact test of contact between the probe and the second contact pad is performed.

A die test system according to an embodiment comprises a data storage module and an analyzer in signal communication with the data storage module and configured to determine first probe parameters for a first die on a wafer based on at least a wafer parameter. A tester is configured to transmit the first probe parameters over a bus. A prober is configured to receive the first probe parameters over the bus, and to bring probes into contact with first contact pads of the first die according to the first probe parameters. The prober has first circuitry configured to perform a probe contact test of a quality of contact between the probes and the first contact pads, and transmit first results of the probe contact test to the analyzer. The analyzer is further configured to receive the first results and to determine second probe parameters based on at least the first results.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   loading a wafer having a first die and a second die into a prober;
   bringing probes of the prober into contact with first contact pads of the first die according to first probe parameters;
   performing a first probe contact test of first values of the contact between the probes and the first contact pads;
   performing a die test of the first die after the performing the probe contact test;
   saving results of the die test and results of the probe contact test;
   automatically generating second probe parameters based on at least the results of the first probe contact test;
   bringing the probes of the prober into contact with the first contact pads of the first die according to the second probe parameters, the first probe parameters being different than the second probe parameters;
   prior to testing another die, retesting the first die by performing a second probe contact test of second values of the contact between the probes and the first contact pads; and
   automatically generating third probe parameters based on at least the results of the second probe contact test.

2. The method of claim 1, further comprising:
   bringing probes of the prober into contact with second contact pads of the second die according to the third probe parameters; and
   performing a third probe contact test of third values of the contact between the probes and the second contact pads.

3. The method of claim 2, wherein the first values, the second values, and the third values are resistances.

4. The method of claim 2, wherein the first probe parameters, the second probe parameters, and the third probe parameters each comprise a probe cleaning frequency, a probe overdrive or a touchdown count.

5. The method of claim 1, further comprising:
   generating the first probe parameters based on at least a wafer parameter or a lot parameter.

6. The method of claim 5, wherein the first probe parameters are generated based on results of a previous first probe contact test.

7. The method of claim 1, further comprising modifying one of lot parameters and wafer parameters based on the results of the die test or the results of the first probe contact test.

8. A method, comprising:
- determining a wafer parameter for a wafer in a die test system;
- determining first probe parameters for a first die on the wafer based on at least the wafer parameter;
- bringing a probe into contact with a first contact pad of the first die according to the first probe parameters;
- performing a first probe contact test of contact between the probe and the first contact pad;
- automatically determining second probe parameters for the first die based on at least first results of the first probe contact test;
- bringing the probe into contact with the first contact pad of the first die according to the second probe parameters;
- performing a second probe contact test of contact between the probe and the first contact pad;
- automatically determining third probe parameters for a second die based on at least second results of the second probe contact test;
- bringing the probe into contact with a second contact pad of the second die according to the third probe parameters; and
- performing a third probe contact test of contact between the probe and the second contact pad.

9. The method of claim 8, wherein the first results comprise a resistance of a contact between the probe and the first contact pad.

10. The method of claim 8, wherein the first probe parameters, the second probe parameters, and the third probe parameters each comprise a probe cleaning frequency, a probe overdrive or a touchdown count.

11. The method of claim 10, wherein the bringing the probe into contact with the first contact pad comprises cleaning the probe upon determining that the probe should be cleaned according to the probe cleaning frequency.

12. The method of claim 8, wherein the first die is a different die than the second die.

13. The method of claim 8, further comprising performing a die test of the first die after the performing the probe contact test and using the probe in contact with the first contact pad according to the first probe parameters.

14. The method of claim 13, wherein the third probe parameters for the second die are determined based on at least results of the die test.

15. A die test system, comprising:
- a data storage module;
- an analyzer in signal communication with the data storage module and configured to determine first probe parameters for a first die on a wafer based on at least a wafer parameter;
- a tester configured to transmit the first probe parameters over a bus; and
- a prober configured to receive the first probe parameters over the bus, the prober configured to bring probes into contact with first contact pads of the first die according to the first probe parameters, the prober having first circuitry configured to perform a first probe contact test of a quality of contact between the probes and the first contact pads, the prober further configured to transmit first results of the probe contact test to the analyzer;
- wherein the analyzer is further configured to receive the first results and to determine second probe parameters based on at least the first results, the analyzer further configured to determine whether to perform a second probe contact test of the first die on the wafer based on at least the second probe parameters.

16. The system of claim 15, wherein the first results comprise a resistance of the contact between the probes and the first contact pads.

17. The system of claim 15, wherein the first probe parameters comprise a probe cleaning frequency, a probe overdrive or a touchdown count.

18. The system of claim 15, wherein the first circuitry is further configured to perform a die test of the first die after the performing the second probe contact test and using the probes in contact with the first contact pads according to the second probe parameters.

19. The system of claim 15, wherein the wafer parameter comprises a warpage of the wafer.

20. The system of claim 18, wherein the analyzer is further configured to determine whether to perform a second test of the first die.

* * * * *